(12) United States Patent
Sheu et al.

(10) Patent No.: US 7,768,822 B2
(45) Date of Patent: Aug. 3, 2010

(54) COMPENSATION CIRCUIT AND MEMORY WITH THE SAME

(75) Inventors: Shyh-Shyuan Sheu, Taichung (TW); Lieh-Chiu Lin, Kaohsiung (TW); Pei-Chia Chiang, Taipei (TW)

(73) Assignees: Nanya Technology Corporation, Taoyuan (TW); Winbond Electronics Corp., Taichung County (TW)

( * ) Notice: Subject to any disclaimer, the term of this patent is extended or adjusted under 35 U.S.C. 154(b) by 397 days.

(21) Appl. No.: 12/000,981

(22) Filed: Dec. 19, 2007

(65) Prior Publication Data
US 2008/0239798 A1    Oct. 2, 2008

(30) Foreign Application Priority Data
Mar. 28, 2007    (TW) .............................. 96110713 A

(51) Int. Cl.
*G11C 11/00*    (2006.01)

(52) U.S. Cl. ............. 365/163; 365/189.16; 365/210.11; 365/211

(58) Field of Classification Search .................. 365/163, 365/189.16, 210.11, 211
See application file for complete search history.

(56) References Cited

U.S. PATENT DOCUMENTS

| 6,928,022 B2 * | 8/2005 | Cho et al. ................. 365/225.7 |
| 7,471,553 B2 * | 12/2008 | Lee et al. ..................... 365/163 |
| 2008/0084734 A1 * | 4/2008 | De Brosse et al. .......... 365/163 |

* cited by examiner

*Primary Examiner*—Anh Phung
*Assistant Examiner*—Toan Le
(74) *Attorney, Agent, or Firm*—Birch, Stewart, Kolasch & Birch, LLP

(57) ABSTRACT

One embodiment of the invention provides a compensation circuit. The compensation circuit comprises a writing driver, a distance detection circuit, an operating element and an auxiliary writing driver. The writing driver provides a writing current to a writing path. The distance detection circuit is coupled to the writing path to detect a distance that the writing current has travelled and outputs a control signal based on the distance. The operating element is coupled to the writing path. The auxiliary writing driver provides an auxiliary current to the writing path based on the control signal.

25 Claims, 5 Drawing Sheets

COMPENSATION CIRCUIT AND MEMORY WITH THE SAME

BACKGROUND OF THE INVENTION

1. Field of the Invention

The present invention relates to a compensation circuit, and more particularly to a memory with compensation circuit.

2. Description of the Related Art

With the growth in the use of portable electronic devices, the desire for non-volatile memory has increased. Among the various kinds of non-volatile, memory, phase change memory is the most competitive next generation non-volatile memory due to its higher speed, lower power consumption, higher capacity, reliability, easier process integration and lower cost. The operation of the phase change memory is mainly achieved by inputting two current pulses with different current magnitudes to the phase change memory. When the phase change memory receives the current pulses, the phase change memory is heated due to Ohm's Law, and the material of the phase change memory therefore transforms to an amorphous state or a crystalline state according to the temperature of the phase change memory. The amorphous state and the crystalline state are reversible and data storage can be achieved by different resistances of the material of the phase change memory at the amorphous state and the crystalline state.

The phase change memory comprises a plurality of writing paths, and each writing path comprises a plurality of phase change memory cells (PCM cells), or so-called GST device, to form a memory array arranged in matrix form. When writing data to the phase change memory, writing current is inputted to a selected writing path via a driving circuit, and the writing current is then inputted to the desired PCM cell via a selector. However, the driving ability of the writing current may decrease due to a voltage drop generated in the current transmission in the writing path. The voltage drop is caused by an equivalent resistor of the conduct line between the driving circuit and the desired PCM cell. Sometimes resulting in the PCM cell at the near side of the driving circuit being accessed normally and the PCM cell at the far side of the driving circuit being accessed abnormally due to insufficient writing current. If the PCM cell receives insufficient writing current, the PCM cell will be incompletely crystallized.

Referring to FIG. 1. FIG. 1 is a schematic diagram of a writing path for a conventional phase change memory device. The writing driver 11 receives a control signal to output a writing current with fixed magnitude to the writing path. The writing current is then transmitted to the corresponding GST device based on the select signals G1 to Gn and selector 12_1 to 12_n. The equivalent resistor, such as the resistor R1 to Rn, is generated in the writing path and the resistance of the equivalent resistor is determined based on, the distance between the corresponding GST device and the writing driver 11. The equivalent resistor causes unnecessary voltage loss and this decreases the driving ability of the writing current. If the PCM cell is at the far side of the writing driver 11, such as a GST device 13_n, the PCM cell may be incompletely crystallized or amorphous due to insufficient writing current.

Conventionally, to solve this problem, the common technique utilized is to increase the magnitude of the writing current, but this may cause the PCM cell which is at the near side of the writer 11, such as the GST device 13_1, of being over-crystallized or over-amorphous. When the described GST device 13_1 is accessed a following time, the GST device 13_1 may be incompletely crystallized or amorphous, or the GST device 13_1 may require larger voltage to be completely crystallized or amorphous. Furthermore, if the GST device 13_1 is incompletely crystallized or amorphous, the resistance of the GST device 13_1 at the crystallized state increases and this reduce the range of sensing margin.

BRIEF SUMMARY OF THE INVENTION

One embodiment of the invention provides a compensation circuit. The compensation circuit comprises a writing driver, a distance detection circuit, an operating element and an auxiliary writing driver. The writing driver provides a writing current to a writing path. The distance detection circuit is coupled to the writing path to detect a distance that the writing current has travelled and outputs a control signal based on the distance. The operating element is coupled to the writing path. The auxiliary writing driver provides an auxiliary current to the writing path based on the control signal.

Another embodiment of the invention provides a memory with a compensation circuit. The memory comprises a plurality of writing paths, a writing driver, a plurality of first selectors, a distance detection circuit and an auxiliary writing driver. Each the writing paths is coupled to a plurality of memory cells. The writing driver provides a writing current to a first writing path. Each of the first selectors is coupled to corresponding writing paths and transfers the writing current to one of the writing paths based on a first control signal. The distance detection circuit is coupled to the first writing path to detect a distance that the writing current has travelled to output a current compensation signal based on the distance. The auxiliary writing driver provides an auxiliary current to the first writing path based on the current compensation signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
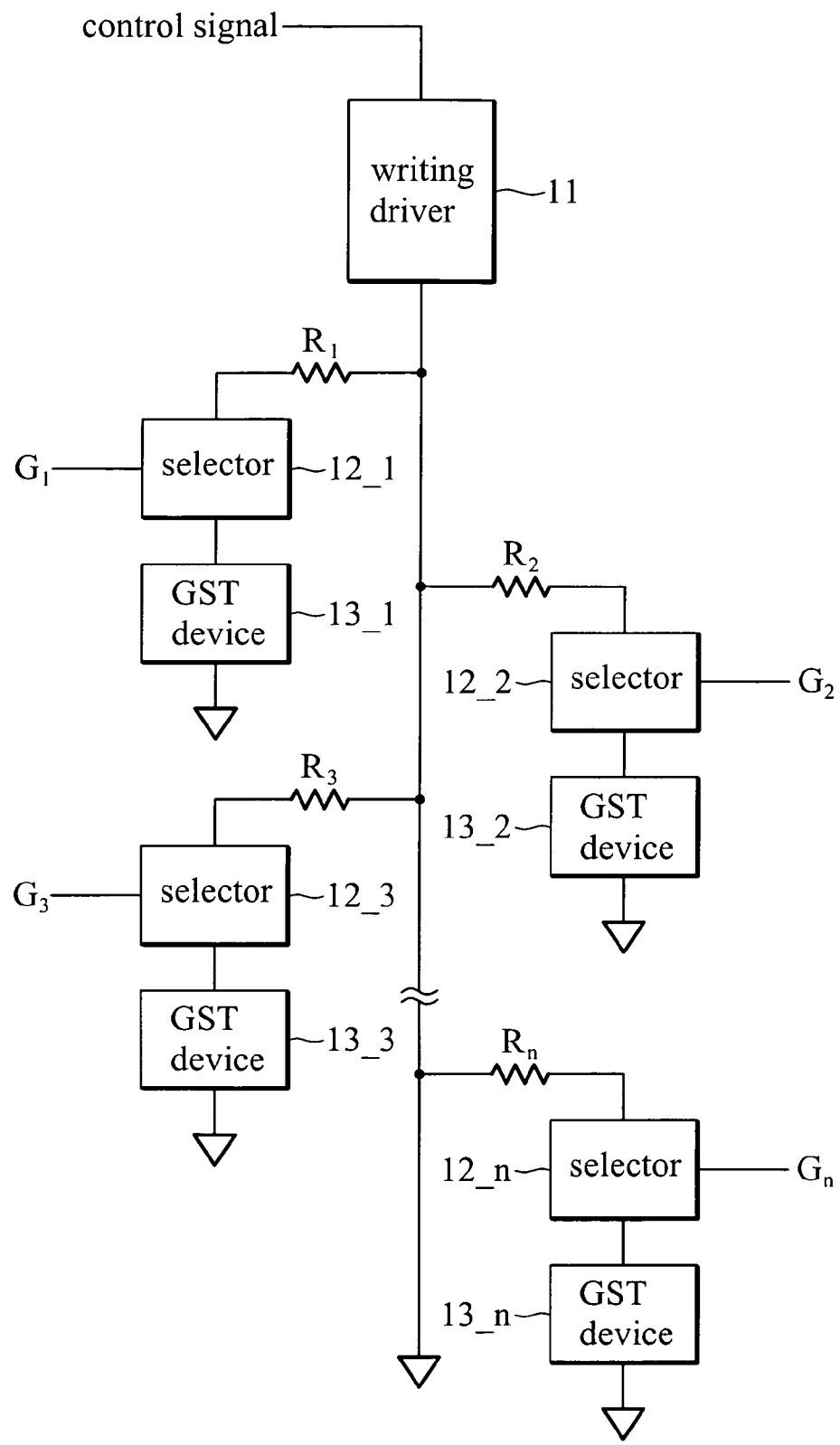
FIG. 1 is a schematic diagram of a writing path for a conventional phase change memory device.
Figure 2:
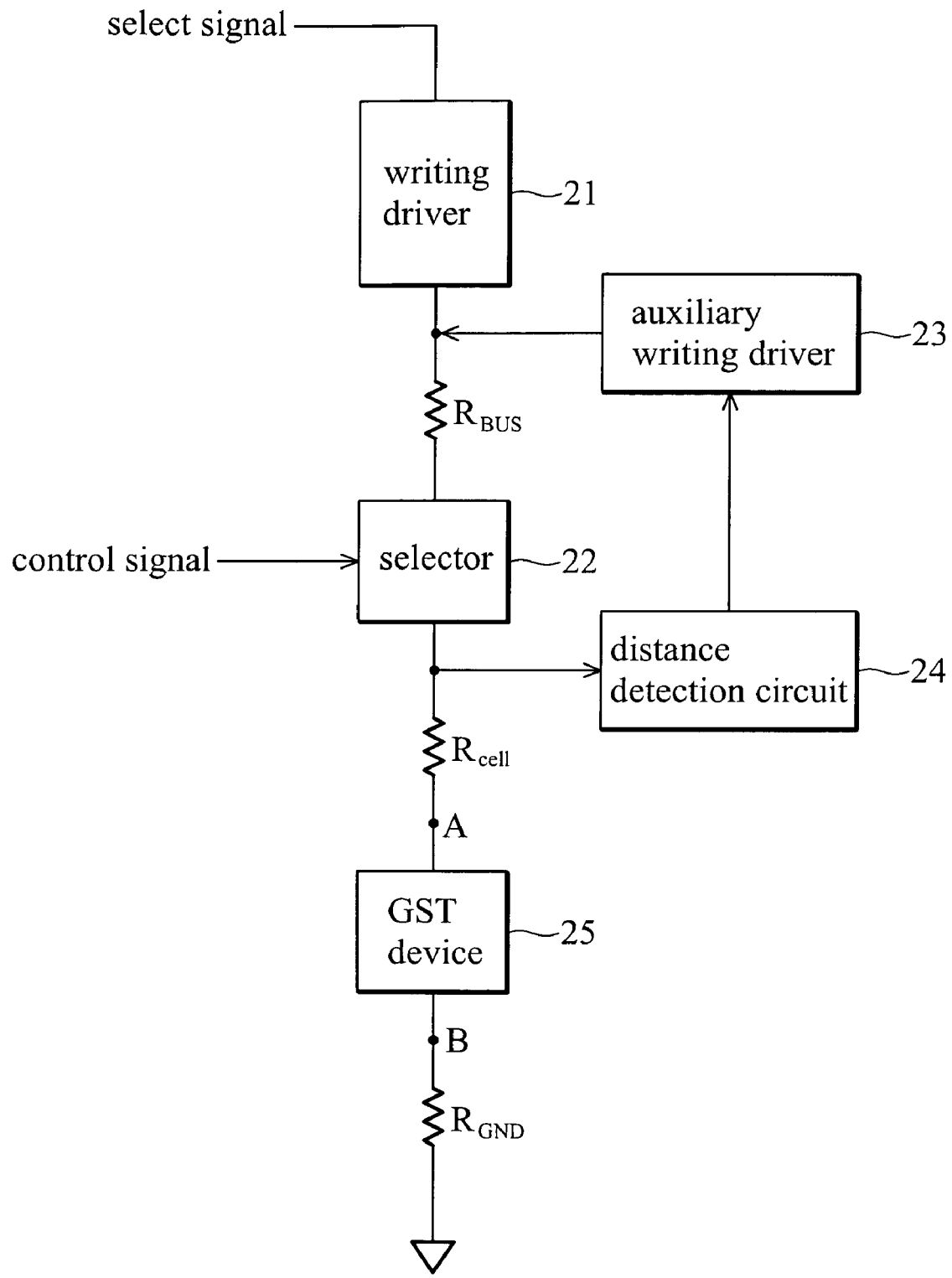
FIG. 2 is a schematic diagram of an embodiment of a writing path with a current compensation circuit of the invention.

FIG. 2 is a schematic diagram of an embodiment of a writing path with a current compensation circuit of the invention. In this embodiment, the current compensation circuit can be applied to serial-connected elements, such as cascaded phase change memory cells (PCM cells), organic light emitting diodes (OLED) or thin film transistor liquid crystal displays (TFT LCD). The current compensation circuit detects a distance that the current has travelled and outputs compensation current based on the distance. In this embodiment, the PCM cells are used for illustration, but is not limiting. The writing driver 21 outputs writing current based on a select signal. The resistor $R_{BUS}$ is coupled between the writing driver 21 and the selector 22 to represent the equivalent resistor of the bus line. The selector 22 transfers the writing current to the GST device 25 according to a ON signal. The resistor Rcell is coupled between the selector 22 and the GST device 25 to represent the equivalent resistor of the conduct line between the selector 22 and the GST device 25. The resistor $R_{GND}$ represents the equivalent resistor of the conduct line between the GST device 25 and the ground. The distance detection circuit 24 is coupled to the selector 22, detects a distance that the current has travelled and outputs a control signal. The auxiliary writing driver 23 is coupled to the output terminal of the distance detection circuit 24 and outputs the auxiliary current. Furthermore, the magnitude of the auxiliary current can be adjusted based on the distance. In this embodiment, the distance detection circuit 24 is not limited to be coupled to the selector 22, and the distance detection circuit 24 can be coupled to any position of the writing path, such as the node A and node B. Moreover, the auxiliary current output by the auxiliary writing driver 23 can be input any position of the writing path, and is not limited to the output terminal of the writing driver 21. In one embodiment, the auxiliary current is directly input to the GST device 25.

In this embodiment, the distance detection circuit 24 outputs the control signal based on a voltage detected from the writing path. When the voltage exceeds a predetermined value, the auxiliary writing driver 23 outputs the auxiliary current to the writing path. In another embodiment, the distance detection circuit 24 searches a voltage-current table based on the detected voltage and outputs corresponding control signal to adjust the magnitude of the auxiliary current output by the auxiliary writing driver 23. In another embodiment, the distance detection circuit 24 compares the detected current with a reference current, and when the detected current is not equal to the reference current, the distance detection circuit 24 outputs the control signal based on the current difference between the detected current and the reference current. In another embodiment, the distance detection circuit 24 comprises a current duplication circuit, such as a current mirror. The current duplication circuit duplicates a plurality of auxiliary currents based on a reference current and parameters, and the current duplication circuit outputs the desired current based on the auxiliary currents, wherein the desired current may be a sum of at least two auxiliary currents or a difference of at least two auxiliary currents. The parameter can be determined based on the resistance of the parasitic resistor of the writing path, and the auxiliary current is a multiple of the reference current.

Figure 3:
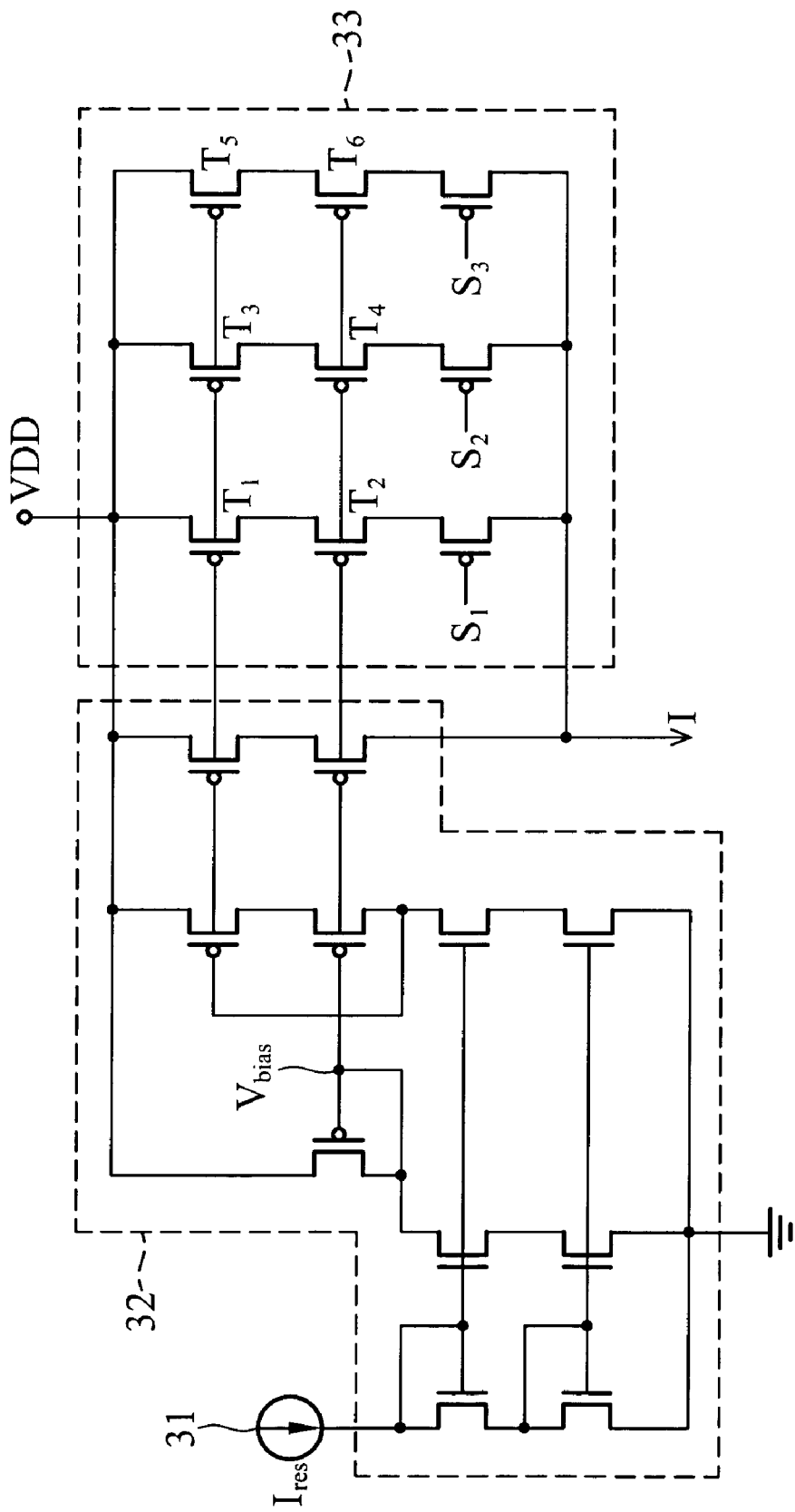
FIG. 3 is a circuit diagram of an embodiment of the writing driver and the auxiliary writing driver shown in FIG. 2.

FIG. 3 is a circuit diagram of an embodiment of the writing driver and the auxiliary writing driver shown in FIG. 2. The writing driver 32 outputs the writing current I based on a reference current $I_{res}$. The auxiliary writing driver 33 utilizes the current duplication mechanism of the current mirror and adjusts the W/L values of the transistors T1, T2, T3, T4, T5 and T6 to output auxiliary current with different magnitudes. In FIG. 3, the magnitude of the auxiliary current can be determined based on the select signal S1, S2 and S3. In this embodiment, the auxiliary writing driver 33 outputs the auxiliary current by a current-sum mechanism. However, those skilled in the Art can change the circuit of the auxiliary writing driver 33 to output the auxiliary current which is subtracted from the current generated by the transistors T1, T2, T3, T4, T5 and T6.

Figure 4:
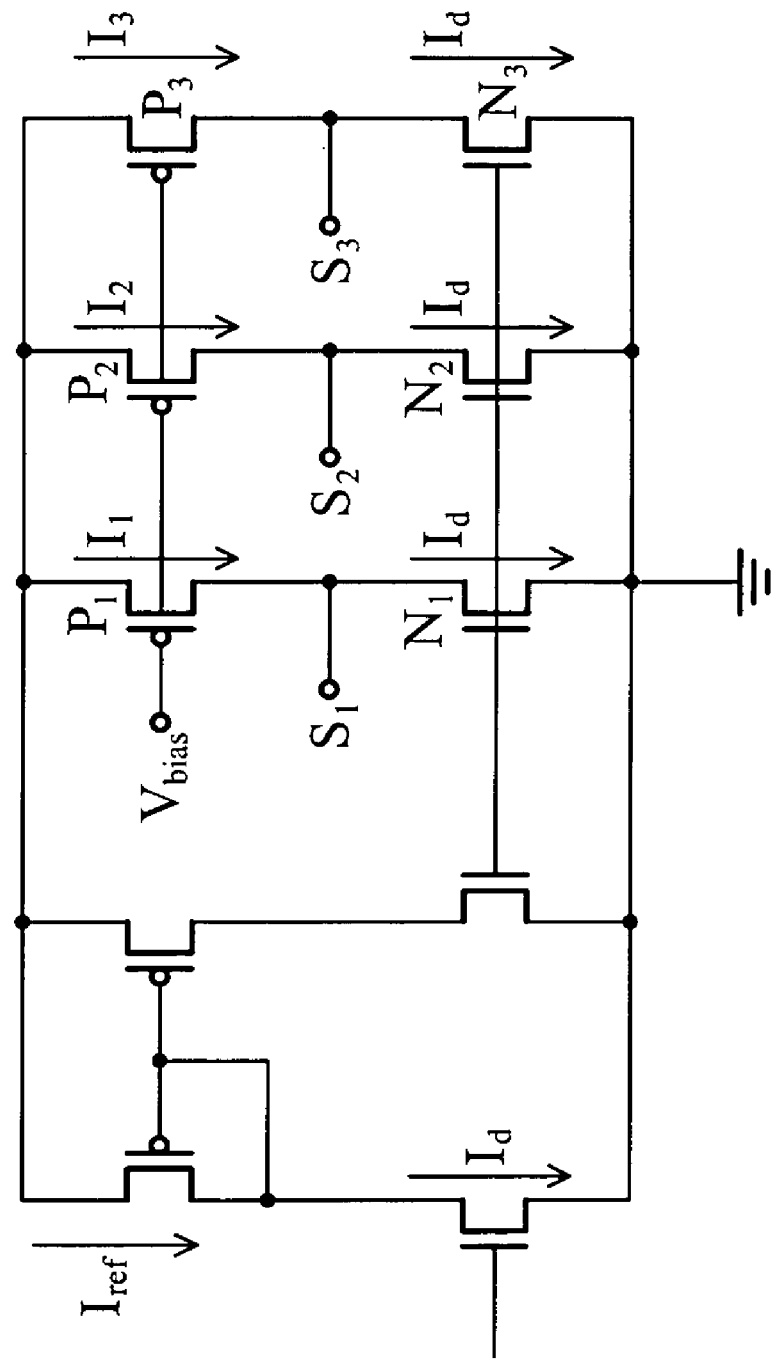
FIG. 4 is a circuit diagram of an embodiment of the distance detection circuit shown in FIG. 2.

FIG. 4 is a circuit diagram of an embodiment of the distance detection circuit shown in FIG. 2. The distance detection circuit comprises a reference current source generating a reference current $I_{ref}$ and the distance detection circuit duplicates the detected writing current $I_d$. In this embodiment, the distance detection circuit controls the conductibility of the transistor by the detected voltage and therefore the writing current can be duplicated to the distance detection circuit, wherein the magnitude of the duplicated current can be adjusted based on the conductibility of the transistor. In this embodiment, the magnitude of the current $I_1$, $I_2$ and $I_3$ are respectively determined based on the W/L value of the transistors P1, P2 and P3. The distance detection circuit compares the current $I_1$, $I_2$ and $I_3$ with the reference current and outputs the select signal S1, S2 and S3 based on the comparison result. For example, if the current $I_1$ is smaller than the current $I_d$ of the transistor N1, the voltage level of the select signal S1 will be at low voltage level, and the transistor controlled by the select signal S1 shown in FIG. 3 will be turned on to output the auxiliary current. In this embodiment, the current $I_1$, $I_2$ and $I_3$ follow the rule: $I_1 < I_2 < I_3$. In this embodiment, the distance detection circuit can further adjust the current through the transistors N1, N2 and N3 by adjusting the W/L values of the transistors N1, N2 and N3.

Figure 5:
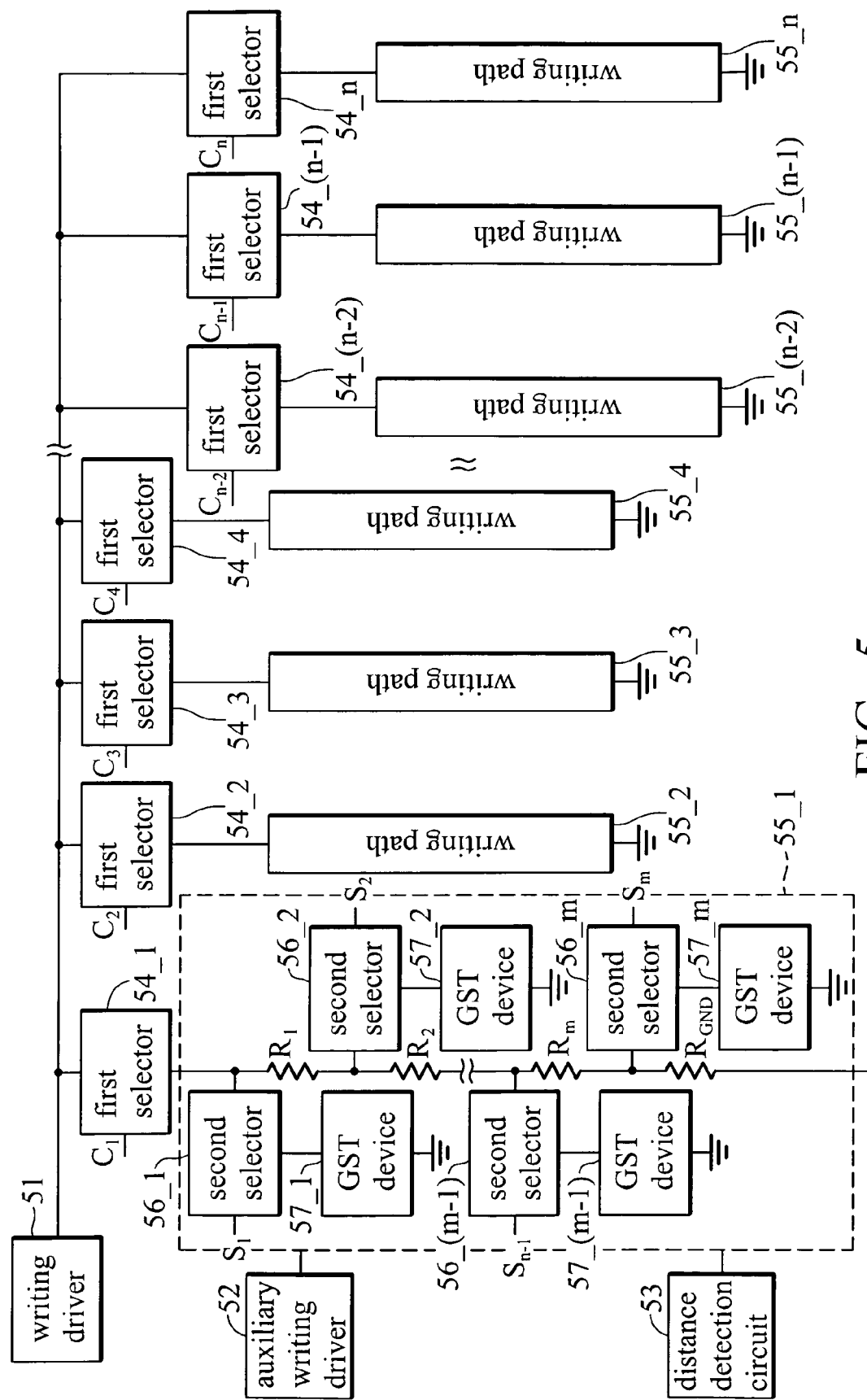
FIG. 5 is a circuit diagram of an embodiment of a phase change memory device with a compensation circuit of the invention.

FIG. 5 is a circuit diagram of an embodiment of a phase change memory with a compensation circuit of the invention. The phase change memory is a memory array arranged in matrix form, comprising of a plurality of writing paths 55_1 to 55_n, and each writing path is coupled to a plurality of GST devices, such as the GST devices 57_1 to 57_m. The writing driver 51 is coupled to a plurality of first selectors 54_1 to 54_n. The writing driver 51 drives a writing path based on the control signals C1 to Cn, wherein the control signals C1 to Cn turn on the corresponding first selector. The writing path 55_1 is coupled to the auxiliary writing driver 52 and the distance detection circuit 53. The auxiliary writing driver 52 controls the magnitude of the auxiliary current based on the detection result of the distance detection circuit 53. In another embodiment, each writing path is coupled to the auxiliary writing driver 52 and the distance detection circuit 53. In another embodiment, the auxiliary writing driver 52 and the distance detection circuit 53 are coupled to the writing paths 55_1 to 55_n via a selector. The selector selects a writing path based on the control signals C1 to Cn, and the auxiliary writing driver 52 outputs the compensation current to the selected writing path based on the detection result from the distance detection circuit 53. For further illustration of the writing path structure, writing path 55_1 is taken as an example. The writing path 55_1 is coupled to GST devices 57_1 to 57_m via the second selectors 56_1 to 56_m. The second selectors 56_1 to 56_m is controlled by the select signal S1 to Sm and transmits the writing current to the corresponding GST device based on the select signal S1 to Sm. The writing path further comprises a plurality of resistors R1 to Rm and $R_{GND}$, wherein the resistors represent the equivalent resistor of part of the conduct line. In this embodiment, the distance detection circuit 53 can be electrically connected to one of the equivalent resistors and outputs the compensation signal to the auxiliary writing driver 52 based on the detected voltage. The auxiliary writing driver 52 then outputs the auxiliary current to the corresponding GST device and the magnitude of the auxiliary current is determined based on the detected voltage.

While the invention has been described by way of example and in terms of preferred embodiment, it is to be understood that the invention is not limited thereto. To the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. A compensation circuit, comprising:
   a writing driver to provide a writing current to a writing path;
   a distance detection circuit coupled to the writing path to detect a distance that the writing current has travelled and to output a control signal based on the distance;
   an operating element coupled to the writing path; and
   an auxiliary writing driver to provide an auxiliary current to the writing path based on the control signal.

2. The circuit as claimed in claim 1, further comprising a selector to transfer the writing current to the operating element based on an ON signal, wherein the ON signal is used to turn on the selector.

3. The circuit as claimed in claim 1, wherein the distance detection circuit detects a resistance of the writing path, generates a voltage based on the resistance, and when the voltage exceeds a predetermined value, the auxiliary writing driver outputs the auxiliary current to the writing path.

4. The circuit as claimed in claim 1, wherein the distance detection circuit searches a voltage current table based on a voltage of the writing path and outputs the control signal to control the magnitude of the auxiliary current.

5. The circuit as claimed in claim 1, wherein the distance detection circuit provides a reference current and when the writing current is not equal to the reference current, the distance detection circuit outputs the control signal.

6. The circuit as claimed in claim 5, wherein the distance detection circuit further comprises a current mirror to duplicate the writing current.

7. The circuit as claimed in claim 5, wherein the control signal is a low voltage signal.

8. The circuit as claimed in claim 1, wherein the auxiliary writing driver is a current duplication circuit outputting the auxiliary current based on a reference current and a parameter, wherein the auxiliary current is multiple of the reference current.

9. The circuit as claimed in claim 8, wherein the reference current is the writing current.

10. The circuit as claimed in claim 1, wherein the operating element is a memory cell, an organic light-emitting diode or a TFT-LCD.

11. The circuit as claimed in claim 10, wherein the memory cell is a phase change memory cell.

12. The circuit as claimed in claim 1, wherein the control signal is a voltage signal, and when the voltage level of the control signal exceeds a predetermined value, the auxiliary writing driver provides the auxiliary current to the writing path.

13. A memory with a compensation circuit, comprising:
    a plurality of writing paths, each writing path is coupled to a plurality of memory cells;
    a writing driver to provide a writing current to a first writing path;
    a plurality of first selectors, each of the first selectors coupled to corresponding writing paths and transmitting the writing current to one of the writing paths based on a first control signal;
    a distance detection circuit coupled to the first writing path to detect a distance that the writing current has travelled and to output a current compensation signal based on the distance; and
    an auxiliary writing driver to provide an auxiliary current to the first writing path based on the current compensation signal.

14. The memory as claimed in claim 13, further comprising a plurality of second selectors to transfer the writing current to one of the memory cells coupled to the first writing path based on a second control signal.

15. The memory as claimed in claim 13, wherein the distance detection circuit detects a resistance of the first writing path, generates a voltage based on the resistance, and when the voltage exceeds a predetermined value, the auxiliary writing driver outputs the auxiliary current to the writing path.

16. The memory as claimed in claim 13, wherein the distance detection circuit searches a voltage current table based on a voltage of the first writing path and outputs the control signal to control the magnitude of the auxiliary current.

17. The memory as claimed in claim 13, wherein the distance detection circuit provides a reference current and when the writing current is not equal to the reference current, the distance detection circuit outputs the current compensation signal.

18. The memory as claimed in claim 17, wherein the distance detection circuit further comprises a current mirror to duplicate the writing current.

19. The circuit as claimed in claim 17, wherein the current compensation signal is a low voltage signal.

20. The memory as claimed in claim 13, wherein the auxiliary writing driver is a current duplication circuit outputting the auxiliary current based on a reference current and a parameter, wherein the auxiliary current is a multiple of the reference current.

21. The memory as claimed in claim 20, wherein the reference current is the writing current.

22. The memory as claimed in claim 13, wherein the distance detection circuit selects the first writing path via a writing path selector when receiving the first control signal.

23. The memory as claimed in claim 13, wherein the auxiliary writing driver selects the first writing path via a writing path selector when receiving the first control signal.

24. The memory as claimed in claim 13, wherein the memory cell is a phase change memory cell.

25. The memory as claimed in claim 13, wherein the current compensation signal is a voltage signal, and when the voltage level of the control signal exceeds a predetermined value, the auxiliary writing driver provides the auxiliary current to the writing path.

* * * * *